(12) United States Patent
Yoon et al.

(10) Patent No.: US 7,492,419 B2
(45) Date of Patent: Feb. 17, 2009

(54) LIQUID CRYSTAL DISPLAY

(75) Inventors: Jin Mo Yoon, Gyeonggi-do (KR); Jae Sung Yu, Seoul (KR)

(73) Assignee: LG Display Co., Ltd., Seoul (KR)

( * ) Notice: Subject to any disclaimer, the term of this patent is extended or adjusted under 35 U.S.C. 154(b) by 414 days.

(21) Appl. No.: 11/455,707

(22) Filed: Jun. 20, 2006

(65) Prior Publication Data

US 2006/0284182 A1 Dec. 21, 2006

(30) Foreign Application Priority Data

Jun. 21, 2005 (KR) .................. 10-2005-0053712

(51) Int. Cl.
*G02F 1/136* (2006.01)

(52) U.S. Cl. .................................................. 349/43

(58) Field of Classification Search .................. None
See application file for complete search history.

(56) References Cited

U.S. PATENT DOCUMENTS 6,566,173 B1 * 5/2003 Choi ........................ 438/149
2005/0083445 A1 * 4/2005 Kang et al. ................. 349/42

\* cited by examiner

*Primary Examiner*—Richard H Kim
(74) *Attorney, Agent, or Firm*—Holland & Knight LLP

(57) ABSTRACT

A liquid crystal display device includes first thin film transistor with a first polysilicon active layer in which a first channel area has first grain boundaries, wherein the first thin film transistor has a first channel direction different from a first grain boundary direction of the first grain boundaries, and a second thin film transistor with a second polysilicon active layer in which a second channel area has second grain boundaries, wherein the second thin film transistor has a second channel direction parallel to a second grain boundary direction of the second grain boundaries, wherein the first and second transistors have a substantially same electrical characteristic.

20 Claims, 7 Drawing Sheets

CHANNEL AND GRAIN
BOUNDARY DIRECTION

LIQUID CRYSTAL DISPLAY

This application claims the benefit of the Korean Patent Application No. P2005-0053712 filed on Jun. 21, 2005 which is hereby incorporated by reference.

BACKGROUND OF THE INVENTION

1. Field of the Invention

The present invention relates to a display device, and more particularly to a liquid crystal display. Although the present invention is suitable for a wide scope of applications, it is particularly suitable for increasing resolution.

2. Description of the Related Art

Silicon is generally classified into amorphous silicon, polycrystalline silicon, and monocrystalline in accordance with a crystallization state of the silicon. The amorphous silicon can be deposited as a thin film at a low temperature of 350° C. or less. Because amorphous silicon can be deposited at a low temperature, amorphous silicon is typically used as a thin film transistor (hereinafter, referred to as 'TFT') for a liquid crystal display device. As size of liquid crystal displays increases, materials with fast electrical characteristics are required to drive large-sized liquid crystal displays. Thus, amorphous silicon can not be used in large-sized liquid crystal display devices, since amorphous silicon has a low mobility of 0.5 $cm^2/Vs$ or less.

Polycrystalline silicon (polysilicon) has a high mobility from several tens of $cm^2/Vs$ to several hundreds of $cm^2/Vs$. Realizing large-sized liquid crystal display device by using polysilicon as the semiconductor layer in a TFT has been actively researched. By using a polysilicon TFT in the liquid crystal display device, there is an advantage in that the drive IC and the TFT array substrate of the display area can be integrated into the same substrate.

A sequential lateral solidification (hereinafter, referring to as 'SLS') of silicon in which an excimer laser is irradiated onto an amorphous silicon thin film to completely melt the thin film and crystallize from the side in a cooling process is mainly used as a method of forming polysilicon. During the cooling process, crystalline striations extend from the sides and grain boundaries extend between the striations. In the case of a TFT using polysilicon, the electrical characteristic of channel mobility is limited by a grain boundary in the channel area of the TFT. To improve the electrical characteristic of the TFT using polysilicon, the orientation of the grain boundaries in the channel should be controlled such that the number of the grain boundaries traverse by current flow in the channel area is minimized. Such a control of the orientation of the grain boundaries can be done by crystallizing the amorphous silicon directionally with the SLS method. In other words, the amorphous silicon is directional crystallized using the SLS process to minimize the grain boundaries traversed by a current in the channel, thereby increasing the mobility of the channel. As a result, the electrical characteristic of the TFT is improved by use of the directionally grown polysilicon. The electrical characteristic of the TFT being dependent upon the grain boundary direction in the channel will be explained in conjunction with FIGS. 1 and 2.

FIG. 1 is a diagram representing polysilicon in the active layer of a liquid crystal display device in the related art. More specifically, FIG. 1 represents a case 1 when a current direction of the TFT channel is parallel to the direction of the grain boundaries, a case 2 when a current direction of the TFT channel forms a 45° angle with the direction of grain boundaries, and a case 3 when a current direction of the TFT channel forms a right angle with the direction of the grain boundaries.

The TFT characteristics of the three cases for the current direction of the TFT channel with respect to the direction of the grain boundaries shown in FIG. 1 are given in Table 1. Hereinafter, the term "channel direction" is the current direction in the channel area. Further, the term "grain boundary direction" is the direction of grain boundaries.

TABLE 1

|  | 1 Solid Line | 2 Dotted Line | 3 Dashed Line |
| --- | --- | --- | --- |
| Channel Orient | Parallel | 45 degree MisOriented | 90 degree MisOriented |
| Mobility | 340 $cm^2/v \cdot sec$ | 230 $cm^2/v \cdot sec$ | 140 $cm^2/v \cdot sec$ |
| Vth | 1.3 V | 1.3 V | 2.0 V |
| S-Factor | 0.45 V/dec | 0.44 V/dec | 1.56 V/dec |

As shown in Table 1, the polysilicon TFT is known to be different in accordance with the channel direction of the TFT with respect to the grain boundary direction of the polysilicon. Further, polysilicon TFT's within the panel having the same channel direction with respect to the grain boundary direction of the polysiliicon will all have similar electrical characteristics. The highest mobility is when the channel direction of a TFT is parallel to the grain boundary direction of the polysilicon in the channel area. The mobility depends on the number of the grain boundaries or the density of the grain boundaries when the channel direction of a TFT is parallel to the grain boundary direction of the polysilicon.

FIG. 2 is a graph representing a current characteristic for a voltage in the three cases of FIG. 1. As shown in FIG. 2, case 1 is a solid line for when a channel direction of the TFT is parallel to the direction of the grain boundary direction of the polysilicon in the channel area, case 2 is a dotted line for when a channel direction of the TFT forms a 45° angle with the direction of the grain boundary direction of the polysilicon in the channel area, case 3 is a dashed line when a channel direction of the TFT forms a right angle with the direction of the grain boundary direction of the polysilicon in the channel area, and when a drain voltage Vd is 10V and 0.1V respectively. Further, the x axis represents a gate voltage Vg and the y axis represents a drain voltage Id.

As shown in FIG. 2, a sub-threshold slope and a threshold voltage Vth are known to depend on the density of the grain boundary direction of the polysilicon in the channel area. The sub-threshold slope is an S shape in Table 1. If a gate voltage is increased slowly in the TFT, the current increase from a voltage below the threshold voltage to finally reach an on-current Ion that drives the TFT, and the sub-threshold slope is an increased amount of the gate voltage when the current is increased ten times from the voltage below the threshold voltage.

In the case when a channel direction of the TFT is parallel to the grain boundary direction of the polysilicon in the channel area such that the number of grain boundaries is minimized in the channel area, the threshold voltage becomes 1.1V and the sub-threshold slope becomes 0.46V/dec. Further, in the case when a channel direction of the TFT forms a right angle with the grain boundary direction of the polysilicon in the channel area such that the number of grain boundaries is maximized in the channel area, the threshold voltage becomes 2.0V and the sub-threshold slope becomes 0.56V/dec. In the case when a channel direction of the TFT forms a 45° angle with the grain boundary direction of the polysilicon in the channel area such that the number of grain boundaries has an intermediate value between the two above cases in the channel area, the threshold voltage becomes 1.4V and the sub-threshold slope becomes 0.47V/dec. Thus, the sub-threshold slope and the threshold voltage depend on the density of the grain boundaries in the channel area.

FIG. 3 is a diagram representing the directions for the current and grain boundaries in the channel area of a thin film transistor in the liquid crystal display device of the related art. All of the channel directions in the channels of TFTs within an LCD panel are typically formed to be parallel to the directions of the grain boundaries in the channel areas' of the TFTs, such as the crystallization growing direction, as shown in FIG. 3. However, to form the polysilicon so that the grain boundaries are in the same direction as the channel direction of the TFTs decreases the layout freedom for the TFTs such that fewer devices can be integrated into an area. The decreased integration can cause other problems. For example, it the area for the drive circuit part of a display panel, which is integrated into the display panel, is increased; the aperture ratio of the pixel is decreased in the case of a high resolution display panel.

SUMMARY OF THE INVENTION

Accordingly, the present invention is directed to a liquid crystal display device that substantially obviates one or more of the problems due to limitations and disadvantages of the related art.

An object of the present invention to provide to a compact liquid crystal display.

Another object of the present invention is to increase the layout freedom for the channel direction of a thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a liquid crystal display device includes a first thin film transistor with a first polysilicon active layer in which a first channel area has first grain boundaries, wherein the first thin film transistor has a first channel direction different from a first grain boundary direction of the first grain boundaries, and a second thin film transistor with a second polysilicon active layer in which a second channel area has second grain boundaries, wherein the second thin film transistor has a second channel direction parallel to a second grain boundary direction of the second grain boundaries, wherein the first and second transistors have a substantially similar electrical characteristic.

In another aspect, a liquid crystal display device includes a first thin film transistor with a first polysilicon active layer in which a first channel area has first grain boundaries at a first grain boundary direction, wherein the first thin film transistor has a first channel direction different from the first grain boundary direction, and a second thin film transistor with a second polysilicon active layer in which a second channel area has second grain boundaries in the first grain boundary direction, wherein the second thin film transistor has a second channel direction parallel to the first grain boundary direction, wherein the first and second transistors have a substantially similar electrical characteristic.

In another aspect, a liquid crystal display device includes a first thin film transistor with a first polysilicon active layer in which a first channel area has first grain boundaries, wherein the first thin film transistor has a first channel direction at a first angle from a first grain boundary direction of the first grain boundaries, a second thin film transistor with a second polysilicon active layer in which a second channel area has second grain boundaries, wherein the second thin film transistor has a second channel direction parallel to a second grain boundary direction of the second grain boundaries, and a third thin film transistor with a third polysilicon active layer in which a third channel area has third grain boundaries, wherein the third thin film transistor has a third channel direction at second angle from the third grain boundary direction of the third grain boundaries, the second angle is different than the first angle, wherein the first, second and third transistors have a similar on-current at a same threshold voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
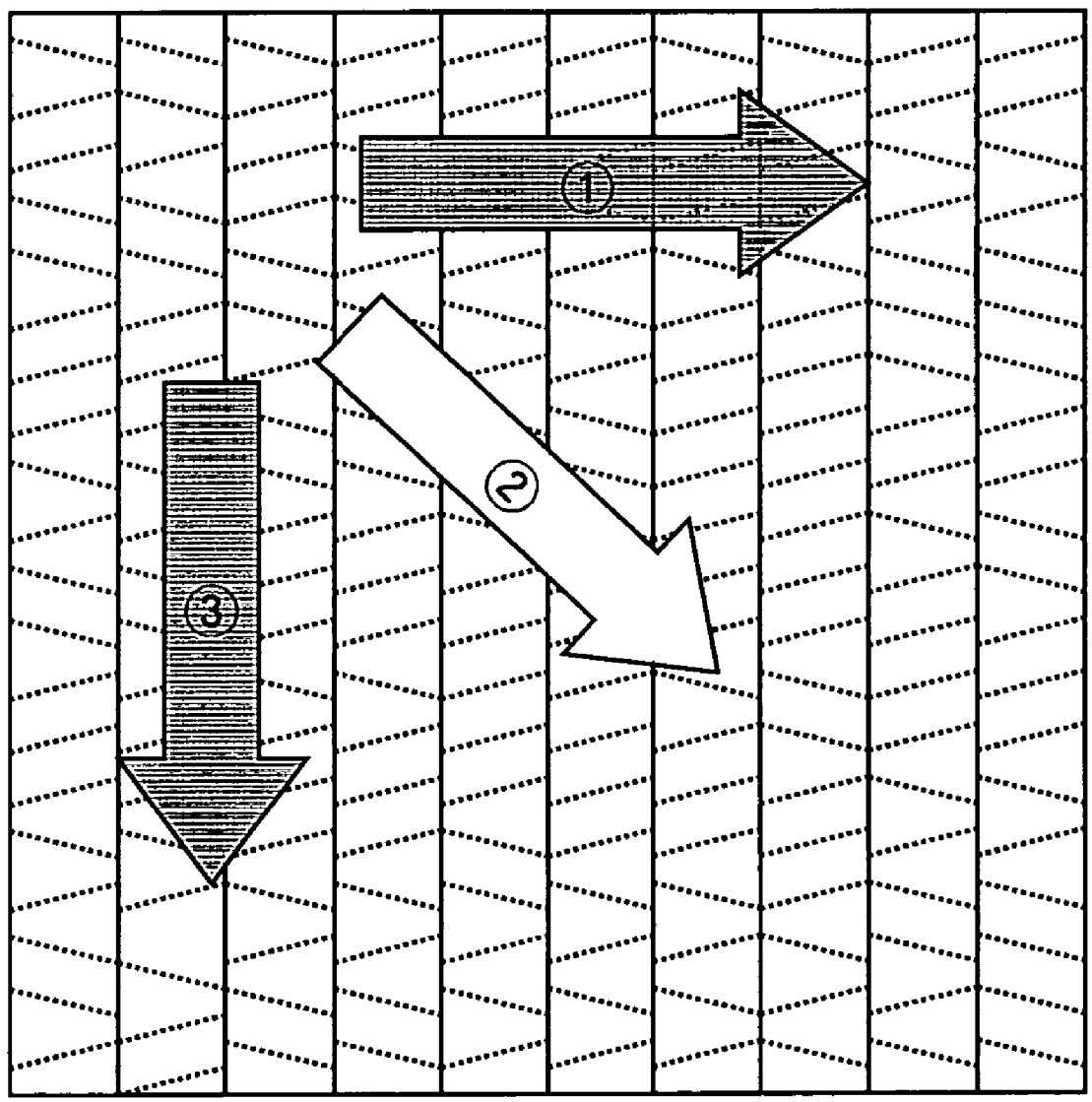
FIG. 1 is a diagram representing polysilicon in the active layer of a liquid crystal display device in the related art.
Figure 2:
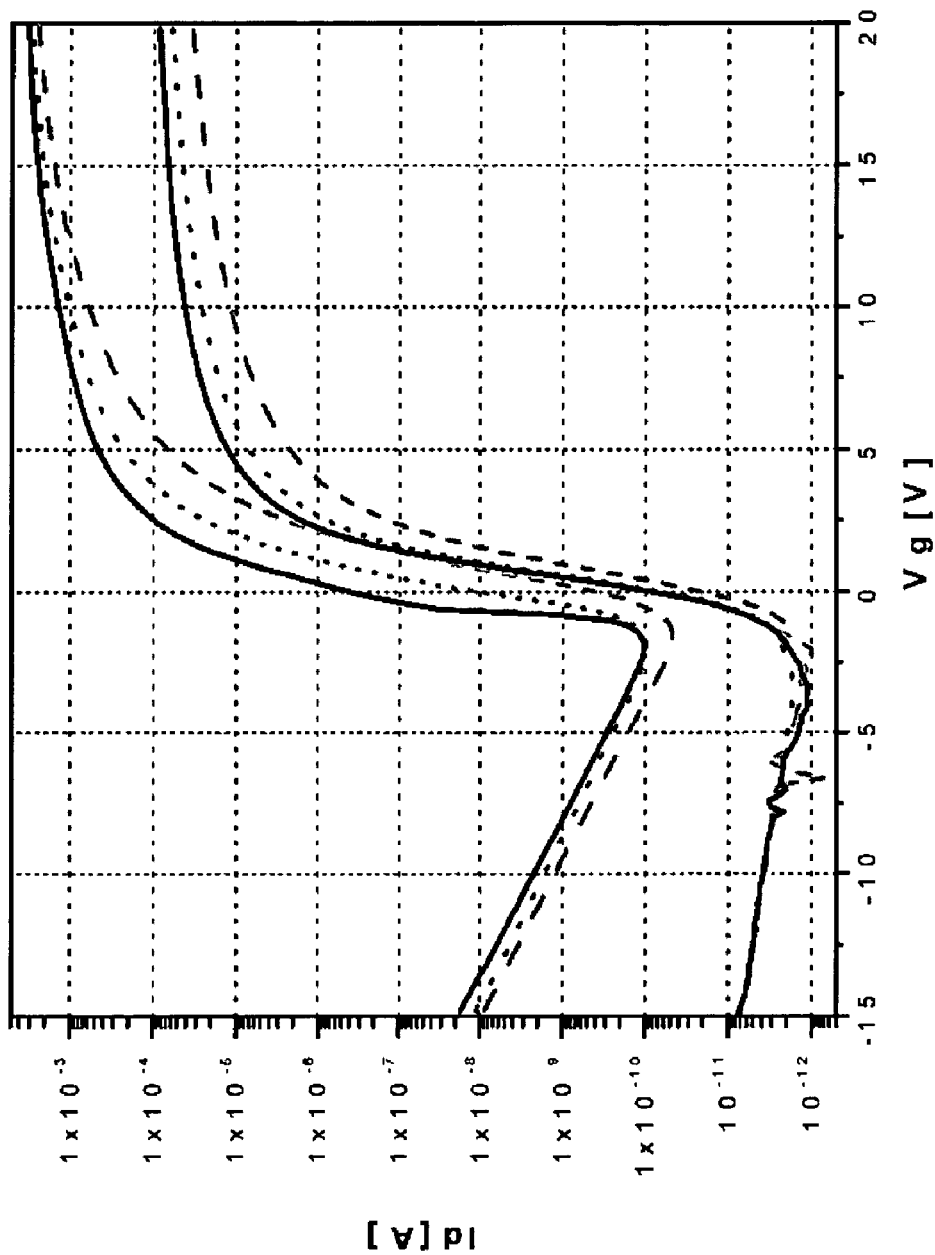
FIG. 2 is a graph representing a current characteristic for a voltage in the three cases of FIG. 1.
Figure 3:
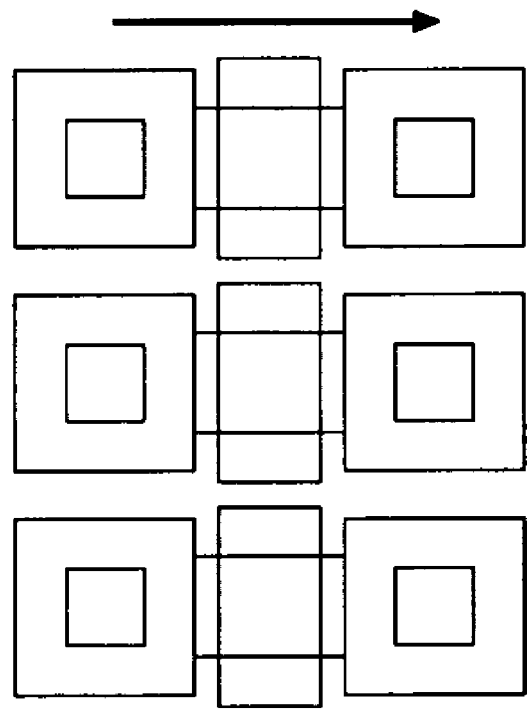
FIG. 3 is a diagram representing the directions for the current and grain boundaries in the channel area of a thin film transistor in the liquid crystal display device of the related art.
Figure 4A:
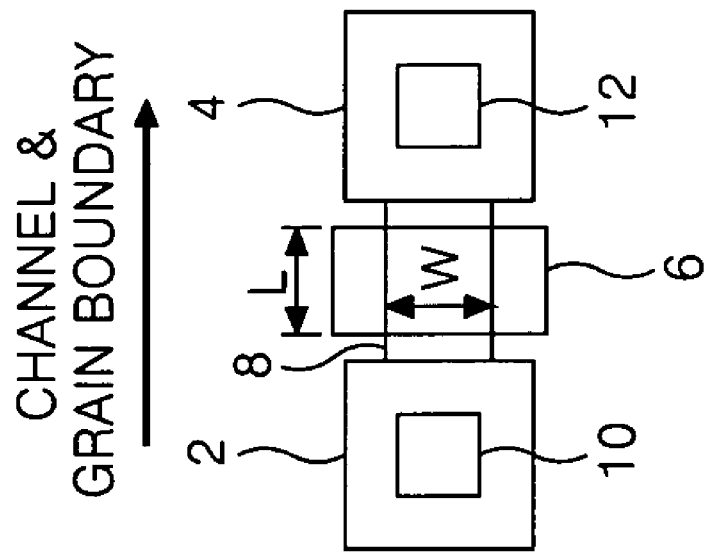
FIGS. 4a to 4c are diagrams showing the directions for the current and grain boundaries in the channel area of a thin film transistor in the liquid crystal display device according to embodiments of the present invention.
Figure 4B:
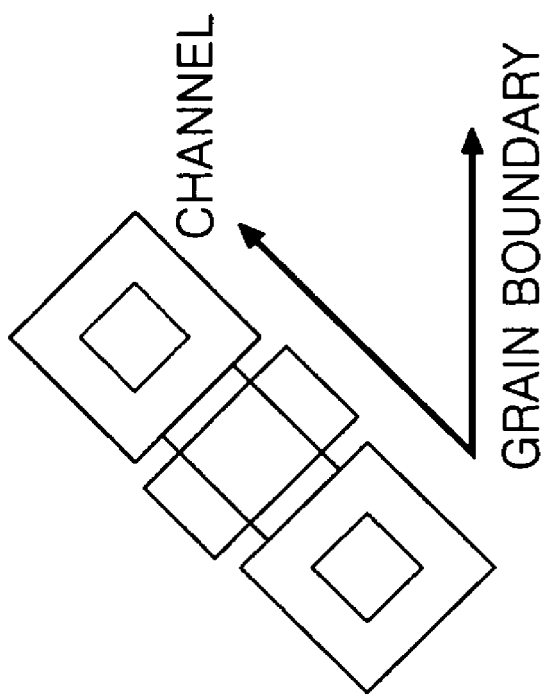
Figure 4C:
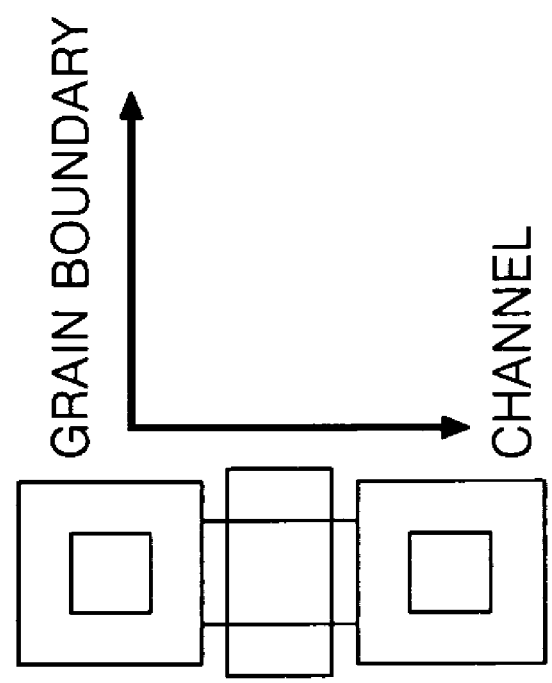

FIGS. 4a to 4c are diagrams showing the directions for the current and grain boundaries in the channel area of a thin film transistor in the liquid crystal display device according to embodiments of the present invention. FIG. 4a is a case (a) when the channel direction of a TFT is parallel to a grain boundary direction of the channel area; FIG. 4b is a case (b) when the channel direction of the TFT forms a 45° angle with the grain boundary direction of the channel area; FIG. 4c is a case (c) when the channel direction of the TFT forms a right angle with the grain boundary direction of the channel area.

As shown in FIG. 4a, a TFT includes an active layer 8 formed with n-type or p-type impurities; a gate electrode 6 formed to overlapping a channel area of the active layer 8 with a gate insulating film (not shown) therebetween; source and drain electrodes 2 and 4 insulated from the gate electrode 6 with an interlayer insulating film (not shown) therebetween; and a passivation film (not shown) formed on the source and drain electrodes 2 and 4. The source and drain electrodes 2 and 4 are each respectively connected to source and drain areas of the active layer 8 after impurities are injected through source and drain contact holes 10 and 12, which penetrate the gate insulating film and the interlayer insulating film. The TFT having such a configuration is disposed on a display panel having a channel direction in which a current flows from the source electrode 2 to the drain electrode 4 to form a designated angle with a grain boundary direction of the polysilicon 8. The channel direction of the TFT in embodiments of the present invention either forms a 45° angle with respect to the grain boundary direction of the polysilicon, a right angle with respect to the grain boundary direction of the polysilicon, or is parallel with respect to the grain boundary direction of the polysilicon. All of the TFTs in FIGS. 4a to 4c can have the same grain boundary direction.

In a liquid crystal display device having a polysilicon TFT drive device, the TFT array part and the circuit part can be integrated together. In the case of a digital interface panel, all the inputted data signals are digital. The digital signals need to be converted to analog for display in the TFT array part. Thus, the circuit part is divided into a digital block and an analog block. The output and input of the digital block only include a high voltage Vdd and a low voltage Vss. In other words, the TFTs in the digital block are driven only by on-current Ion and an off-current Ioff. In contrast, the input and output of the analog block can be all voltages between the high voltage Vdd and the low voltage Vss. In the case of the analog block, an output result for an input can be affected by TFTs having different electrical characteristics in the analog block, thus the TFTs in the analog block should have similar electrical characteristics.

Although the electrical characteristics of the TFT are affected by the directional relationship between the channel directions to the grain boundary direction, the effect on the electrical characteristics can be compensated by adjusting channel dimensions or channel aspect ration of the TFT to act like a TFT having a different channel direction with respect to the grain boundary direction. According to embodiments of the present invention, a ratio of a channel width and a channel length is modified to make a TFT that does not have a channel direction parallel to a grain boundary direction to have the same electrical characteristic, such on-current, like a TFT having a channel direction parallel to the grain boundary direction.

The relationships of the on-currents Id,a, Id,b, Id,c for the three cases (a, b, c) of TFTs shown in FIGS. 4a to 4c at a threshold voltage can be substantially the same, if the ratio of the channel width W and the channel length L of case (b) is a product of the ratio of the channel width W and the channel length L of case (a) multiplied by the ratio of the on-currents, i.e., (Id,b/Id,a), then the electrical characteristic of the TFT of case (b) appears to be the same as the electrical characteristics of the TFT in case (a) at a predetermined threshold voltage, as shown in Mathematical Formula 1.

$$(Wb/Lb)=(Id,b/Id,a)*(Wa/La) \quad \text{[Mathematical Formula 1]}$$

Herein, Wb is a channel width of case (b), Lb is a channel length of case (b), Wa is a channel width of case (a), Lb is a channel length of case (a).

In a similar manner, in the case of (c) of FIG. 4c, if the ratio of the channel width W and the channel length L of case (c) is a product of the ratio of the channel width W and the channel length L of case (a) multiplied by the ratio of the on-currents, i.e., (Id,c/Id,a), then the electrical characteristic of the TFT of (c) appears to be the same as the electrical characteristics of the TFT in case (a) at a predetermined threshold voltage, as shown in Mathematical Formula 2.

$$(Wc/Lc)=(Id,c/Id,a)*(Wa/La) \quad \text{[Mathematical Formula 2]}$$

Herein, Wc represents a channel width W of case (c) and Lc represents a channel length L of case (c).

Figure 5:
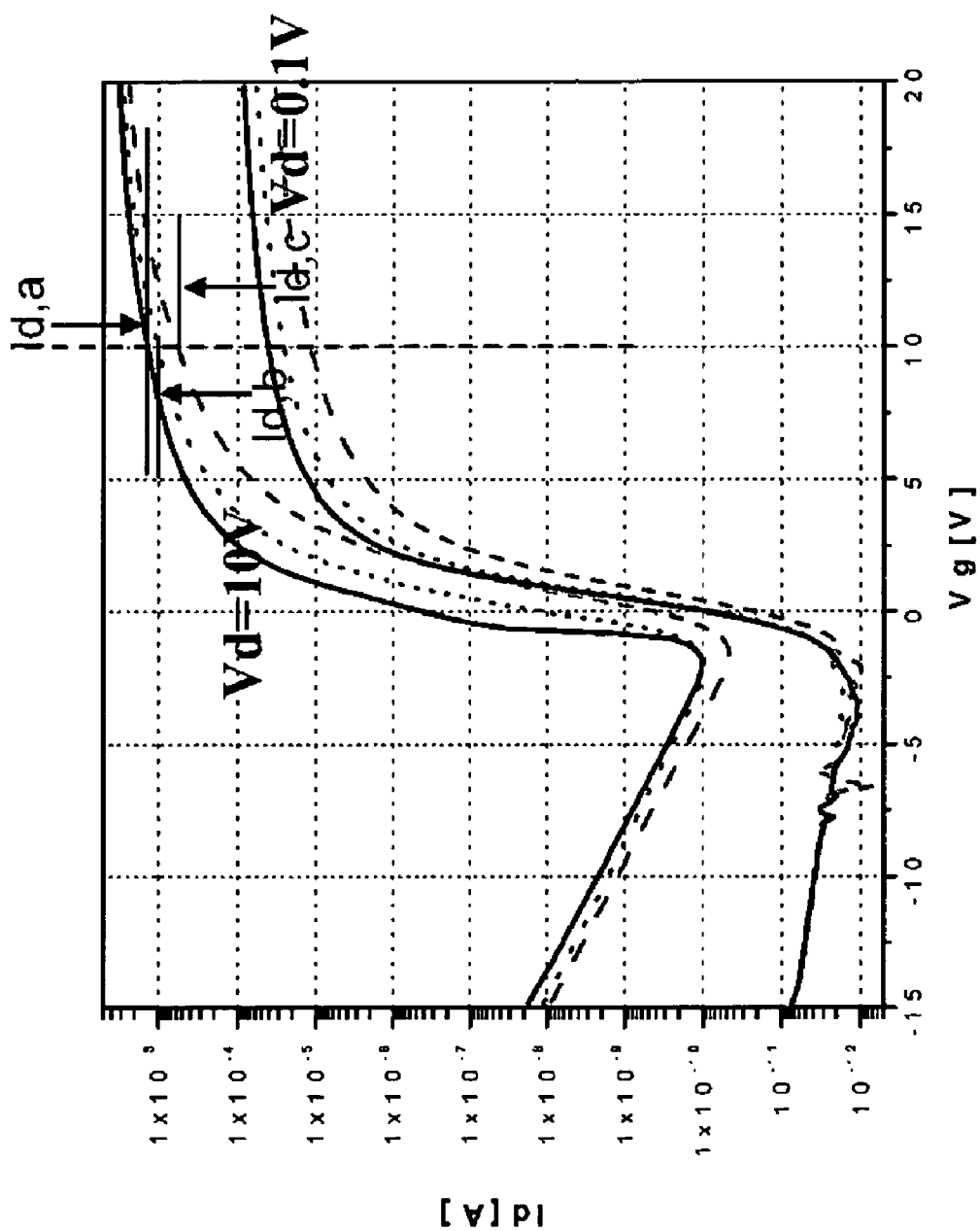
FIG. 5 is a graph representing a current characteristic for a voltage in three cases made by a channel of a thin film transistor and a grain boundary of a polysilicon shown in FIG. 4.

FIG. 5 is a graph representing a current characteristic for a voltage in three cases made by a channel of a thin film transistor and a grain boundary of a polysilicon shown in FIG. 4. By adjusting a channel aspect of a TFT, which does not have a channel direction parallel to the grain boundary direction, to have the same electrical characteristic as another TFT, which does have a channel direction parallel to the grain boundary direction, at a threshold voltage, so that the TFTs have substantially the same on-current at the threshold voltage. In this way, the liquid crystal display device according to embodiments of the present invention can have TFTs with channel directions irrespective of the crystallization directions of the polysilicon in the channel areas and still have a similar electrical characteristic, such as on-current. For example, the analog block liquid crystal display device can have TFTs with at least different channel directions as compared to the grain boundaries of the polysilicon in the channel area of the TFTs. As described above, the liquid crystal display device can form the channel direction of the thin film transistor irrespective of the crystallization direction of the polysilicon, thus the degree of layout freedom is increased. Accordingly, the liquid crystal display device according to embodiments of the present invention can increase integration while maintaining similar electrical characteristics.

It will be apparent to those skilled in the art that various modifications and variations can be made in the liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
    a first thin film transistor with a first polysilicon active layer in which a first channel area has first grain boundaries, wherein the first thin film transistor has a first channel direction different from a first grain boundary direction of the first grain boundaries; and
    a second thin film transistor with a second polysilicon active layer in which a second channel area has second grain boundaries, wherein the second thin film transistor has a second channel direction parallel to a second grain boundary direction of the second grain boundaries, wherein the first and second transistors have a substantially same electrical characteristic.

2. The liquid crystal display device according to claim 1, wherein the substantially same electrical characteristic is at a same threshold voltage for both the first and second thin film transistors.

3. The liquid crystal display device according to claim 2, wherein the substantially same electrical characteristic is on-current.

4. The liquid crystal display device according to claim 1, wherein the first channel direction is at a right angle with respect to the first grain boundary direction.

5. The liquid crystal display device according to claim 1, wherein the first channel direction is at 45° angle with respect to the first grain boundary direction.

6. The liquid crystal display device according to claim 1, wherein the first and second grain boundary directions are in a same direction.

7. The liquid crystal display device according to claim 1, wherein a ratio of a channel width to a channel length of the first thin film transistor satisfies a mathematical formula of $(W/L)=(Id/Idp)*(Wp/Lp)$, where W is a channel width of the first thin film transistor, L is a channel length of the first thin film transistor, Id is an on-current of the first thin film transistor, Idp is an on-current of the second thin film transistor, Wp is a channel width of the second thin film transistor, and Lp is a channel length of the second thin film transistor.

8. The liquid crystal display device according to claim 1, further comprising a third thin film transistor with a third polysilicon active layer in which a third channel area has third grain boundaries, wherein the third thin film transistor has a third channel direction different than a third grain boundary direction of the third grain boundaries, wherein the first, second and third transistors have a substantially same electrical characteristic at a same threshold voltage.

9. The liquid crystal display device according to claim 8, wherein the similar characteristic is on-current.

10. The liquid crystal display device according to claim 8, wherein the first channel direction is at a right angle with respect to the first grain boundary direction and the third channel direction is at 45° angle with respect to the third grain boundary direction.

11. The liquid crystal display device according to claim 8, wherein the first, second, and third grain boundaries are in a same direction.

12. A liquid crystal display device, comprising:
a first thin film transistor with a first polysilicon active layer in which a first channel area has first grain boundaries at a first grain boundary direction, wherein the first thin film transistor has a first channel direction different from the first grain boundary direction; and
a second thin film transistor with a second polysilicon active layer in which a second channel area has second grain boundaries in the first grain boundary direction, wherein the second thin film transistor has a second channel direction parallel to the first grain boundary direction, wherein the first and second transistors have a substantially similar electrical characteristic.

13. The liquid crystal display device according to claim 12, wherein the substantially same electrical characteristic is at a same threshold voltage for both the first and second thin film transistors.

14. The liquid crystal display device according to claim 12, wherein the substantially same electrical characteristic is on-current.

15. The liquid crystal display device according to claim 12, wherein a ratio of a channel width to a channel length of the first thin film transistor satisfies a mathematical formula of (W/L)=(Id/Idp)*(Wp/Lp), where W is a channel width of the first thin film transistor, L is a channel length of the first thin film transistor, Id is an on-current of the first thin film transistor, Idp is an on-current of the second thin film transistor, Wp is a channel width of the second thin film transistor, and Lp is a channel length of the second thin film transistor.

16. The liquid crystal display device according to claim 13, further comprising a third thin film transistor with a third polysilicon active layer in which a third channel area has third grain boundaries in the first grain boundary direction, wherein the third thin film transistor has a third channel direction different than the first grain boundary direction, wherein the first, second and third transistors have a substantially same electrical characteristic at a same threshold voltage.

17. The liquid crystal display device according to claim 16, wherein the similar characteristic is on-current.

18. The liquid crystal display device according to claim 16, wherein the first channel direction is at a right angle with respect to the first grain boundary direction and the third channel direction is at 45° angle with respect to the first grain boundary direction.

19. A liquid crystal display device, comprising:
a first thin film transistor with a first polysilicon active layer in which a first channel area has first grain boundaries, wherein the first thin film transistor has a first channel direction at a first angle from a first grain boundary direction of the first grain boundaries;
a second thin film transistor with a second polysilicon active layer in which a second channel area has second grain boundaries, wherein the second thin film transistor has a second channel direction parallel to a second grain boundary direction of the second grain boundaries; and
a third thin film transistor with a third polysilicon active layer in which a third channel area has third grain boundaries, the third thin film transistor has a third channel direction at second angle from the third grain boundary direction of the third grain boundaries, the second angle is different than the first angle, wherein the first, second and third transistors have a similar on-current at a same threshold voltage.

20. The liquid crystal display device according to claim 19, wherein the first, second, and third grain boundaries are in a same direction.

* * * * *